United States Patent [19]
Wanlass

[11] Patent Number: 5,981,326
[45] Date of Patent: Nov. 9, 1999

[54] DAMASCENE ISOLATION OF CMOS TRANSISTORS

[76] Inventor: Frank M. Wanlass, 2655 Keystone Ave. #4, Santa Clara, Calif. 95051

[21] Appl. No.: 09/046,243

[22] Filed: Mar. 23, 1998

[51] Int. Cl.[6] .............................................. H01L 21/8238
[52] U.S. Cl. ....................... 438/227; 438/298; 438/443; 438/482; 438/692; 148/DIG. 1; 148/DIG. 51; 148/DIG. 85; 148/DIG. 117
[58] Field of Search ..................... 438/199, 218, 438/225, 227, 297, 298, 443, 482, 691, 692, FOR 216, FOR 217, FOR 218, FOR 229, FOR 154, FOR 261, FOR 338; 148/DIG. 1, DIG. 51, DIG. 85, DIG. 117

[56] References Cited

U.S. PATENT DOCUMENTS 4,110,899  9/1978  Nagasawa et al. ..................... 438/227
4,412,375  11/1983  Matthews ................................ 438/227

FOREIGN PATENT DOCUMENTS 358017655  2/1983  Japan ............................. 438/FOR 216
60-226166  11/1985  Japan ............................. 438/FOR 217

*Primary Examiner*—Peter Toby Brown
*Assistant Examiner*—Long Pham

[57] ABSTRACT

This invention is a processing method for electrically isolating CMOS transistors. The method involves implanting a channel stop dopant into field regions between transistor active regions, self aligning relatively thick silicon dioxide over these field regions and providing thin oxide in the active regions that are self aligned to the field regions. The method does not require any shallow trench isolation (STI), and does not require Local Oxidation of Silicon (LOCOS), thereby resulting in little damage to the silicon.

9 Claims, 8 Drawing Sheets

DAMASCENE ISOLATION OF CMOS TRANSISTORS

FIELD OF THE INVENTION

This invention is a processing method for electrically isolating CMOS transistors. The method does not require any shallow trench isolation (STI), and does not require Local Oxidation of Silicon (LOCOS), thereby resulting in little damage to the silicon.

BACKGROUND OF THE INVENTION

High density complementary metal oxide silicon (CMOS) circuits require advanced isolation techniques. Local Oxidation of Silicon (LOCOS) has been used for several years for isolation. In this technique silicon dioxide is grown on the silicon field regions between devices, with silicon nitride preventing oxide growth on the silicon regions that will become device channels and junctions. LOCOS is not suitable for isolating very small submicron transistors, because the oxide growth will encroach laterally beneath the nitride masking layer for a distance that will substantially reduce small device dimensions.

More recently shallow trench isolation (STI) has become popular for submicron isolation. In this technique a shallow trench is etched in the silicon surrounding the active device, the trench is overfilled with silicon dioxide, and chemical mechanical polishing is used to planarize the surface to the original silicon surface. STI is not without problems: 1- The silicon etch can damage the silicon. 2- Source to drain leakage can develop along the sharp corner at the edge of the silicon. 3- The gate oxide breakdown voltage can be lowered along this sharp corner.

SUMMARY OF THE INVENTION

The present invention is a method for implanting a channel stop dopant into field regions between transistor active regions, self aligning relatively thick silicon dioxide over these field regions and providing thin oxide in the active regions that are self aligned to the field regions.

DETAILED DESCRIPTION OF THE INVENTION

The following is a description of a preferred process flow for isolating CMOS transistors according to this invention, where the thicknesses shown are representative of the requirements for a low voltage CMOS logic circuit. Other thicknesses can be used for different applications.

Figure 1:
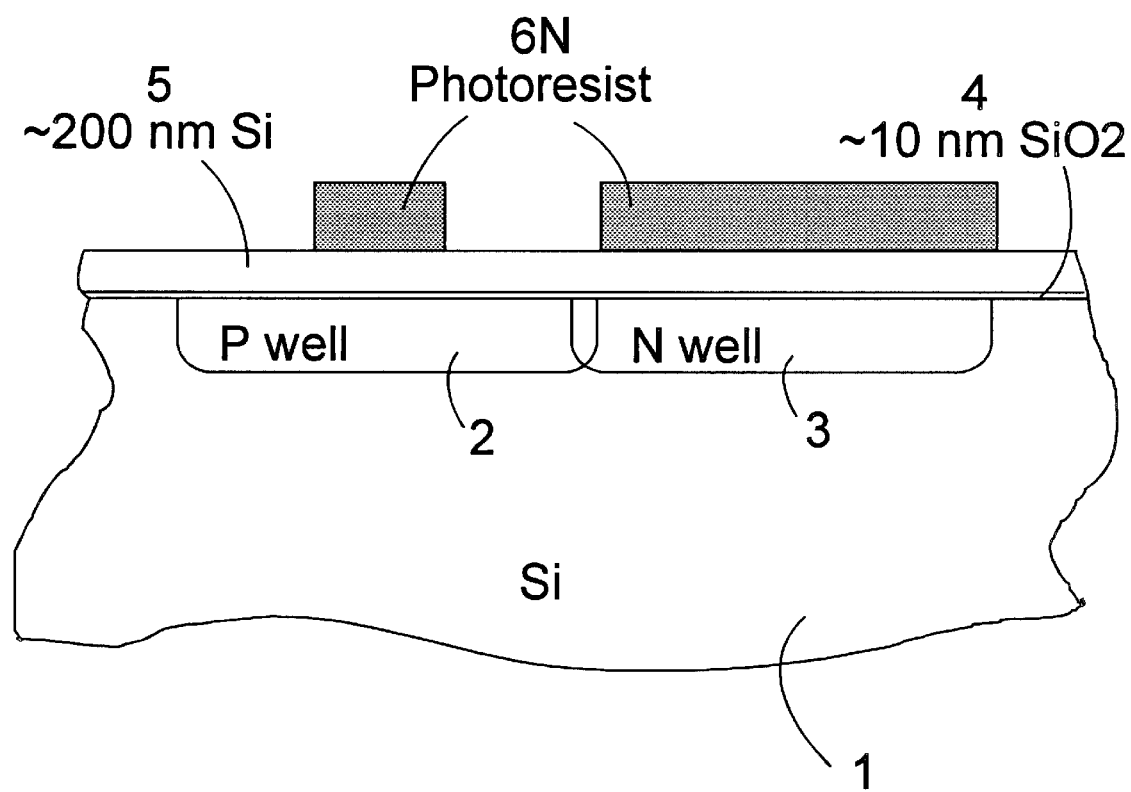
FIG. 1 is across section of a portion of a wafer at the beginning of this invention, where wells have been previously formed, where $SiO_2$ has been grown and amorphous Si has been deposited, and where photoresist has been patterned to define NMOS transistors.

1. FIG. 1 shows, at the start of the process, a portion of a silicon (Si) wafer 1 with previously implanted and diffused P well region 2, and N well region 3. Also shown is a grown silicon dioxide ($SiO_2$) layer 4 with a thickness of ~10 nm, and a deposited amorphous Si layer 5 with a thickness of ~200 nm. A photoresist pattern 6N defines the location of NMOS transistor regions in the P well, and the photoresist entirely covers the N well.

Figure 2:
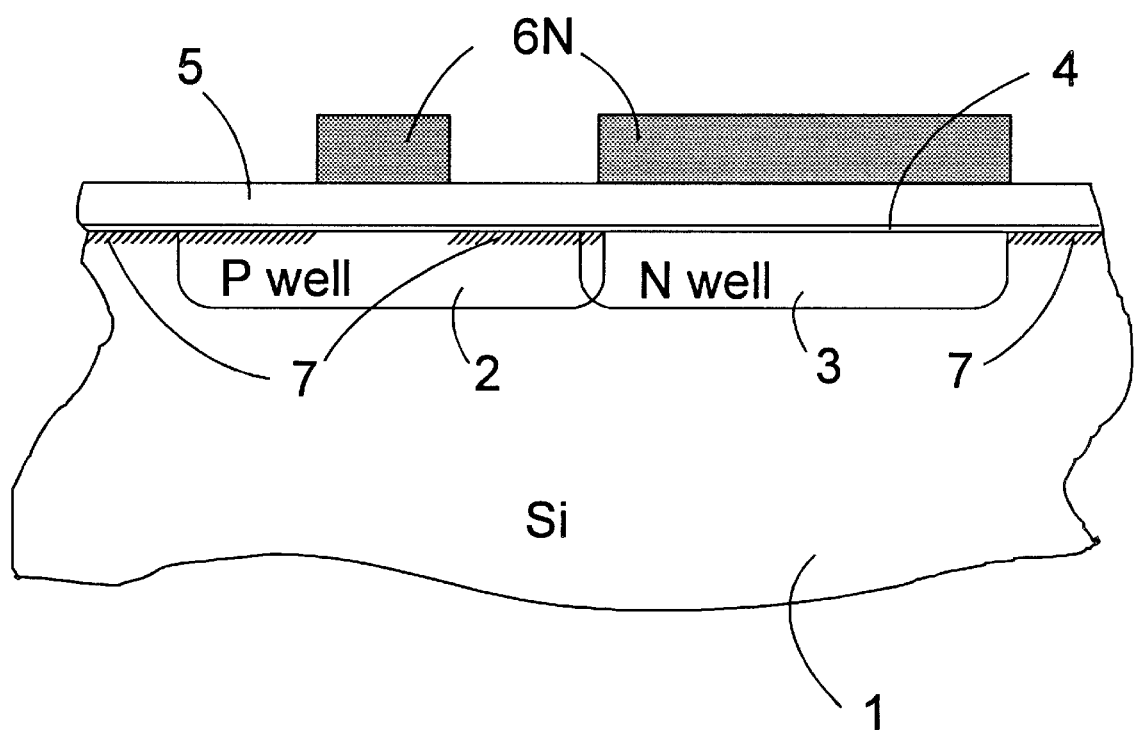
FIG. 2 shows the wafer after implanting boron.

2. With the photoresist in place a boron implant is performed. As shown in FIG. 2, the implant energy should be adjusted to place the boron ions 7 at an approximate depth equal to the amorphous Si thickness, but the energy should not be high enough to penetrate the combined photoresist and amorphous Si thickness. The dose should be at least enough to make the implanted boron concentration equal to 3 or 4 times the original boron concentration of the P well at the silicon substrate surface; this will insure a high field inversion voltage. Optionally, the amorphous Si can be partially anisotropically plasma etched to reduce its thickness before this boron implant.

Figure 3:
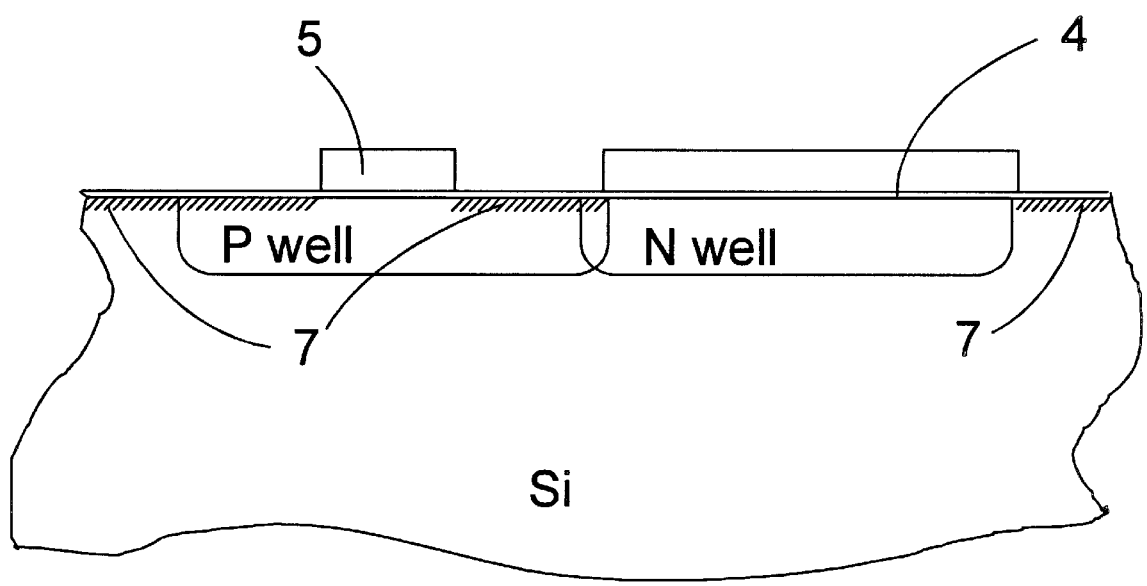
FIG. 3 shows the wafer after the first amorphous Si etch.

3. Next the amorphous Si is completely anisotropically plasma etched, stopping at the underlying thin $SiO_2$. FIG. 3 shows the wafer at this point after photoresist removal.

Figure 4:
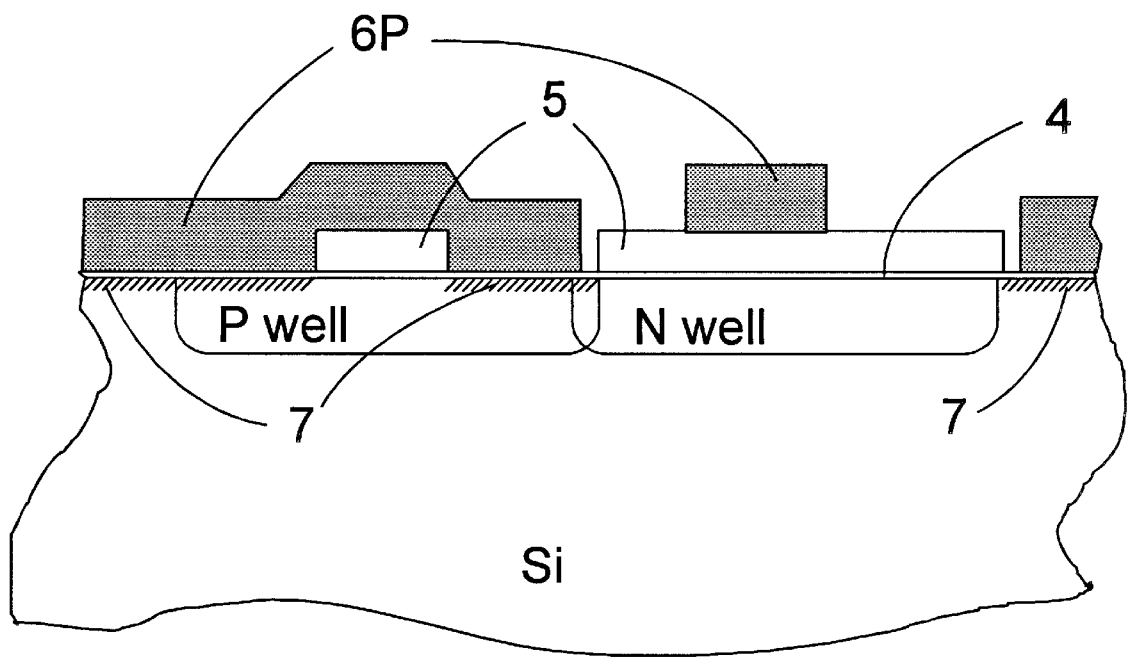
FIG. 4 shows the wafer after coating with and patterning photoresist to define PMOS transistors.

4. Next, as shown in FIG. 4, photoresist 6P is applied and patterned to define the PMOS transistors, and to completely cover the P well.

5. A phosphorus implant is performed with enough energy to place the ions 8 at the interface between the silicon wafer and the $SiO_2$, with the dose high enough to make the implanted concentration 3 or 4 times the concentration of the N well at the silicon surface. Again, optionally, the amorphous Si can be partially anisotropically plasma etched to reduce its thickness before this phosphorus implant.

Figure 5:
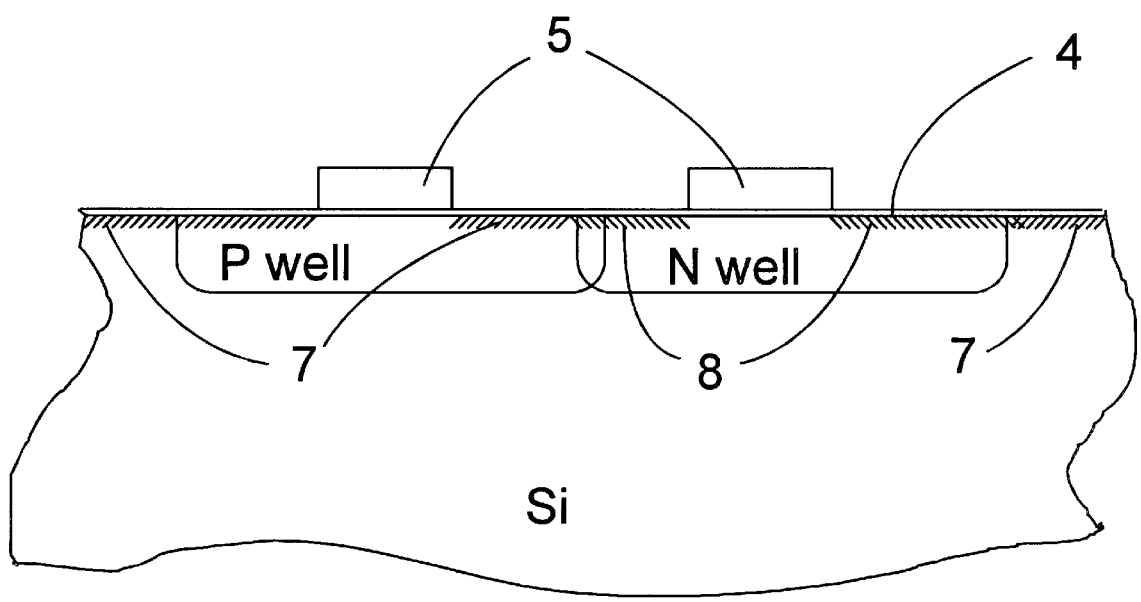
FIG. 5 shows the wafer after implanting phosphorus and etching Si.

6. Next the amorphous Si is etched to the underlying thin oxide. FIG. 5 shows the wafer at this point after photoresist removal.

Figure 6:
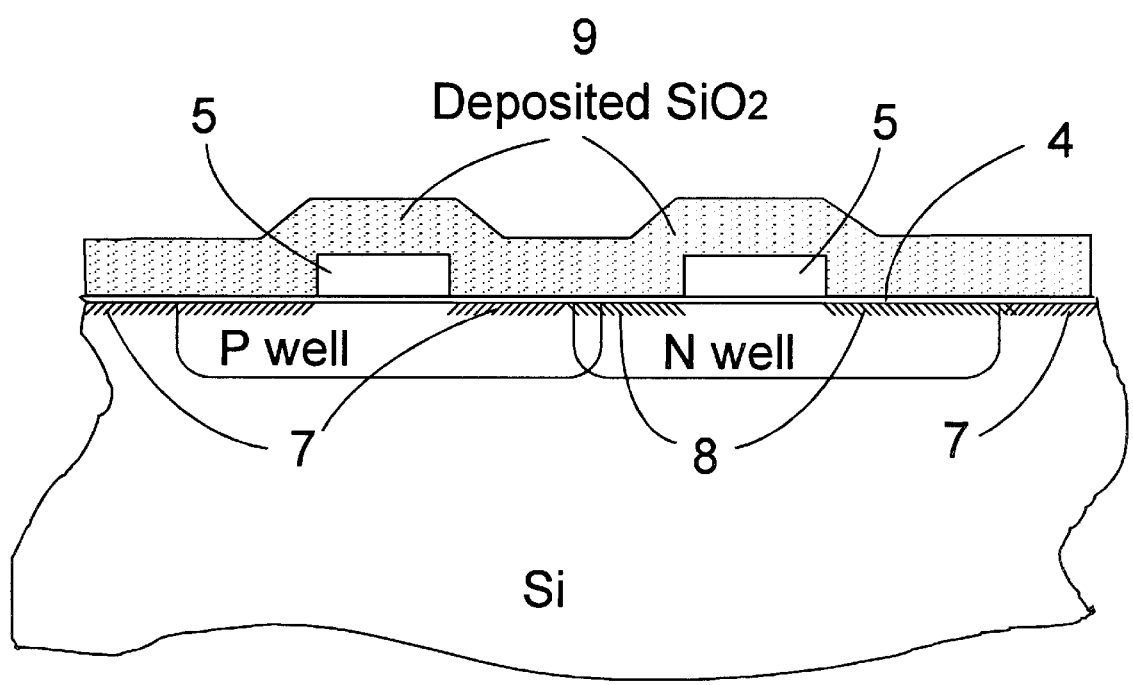
FIG. 6 shows the wafer after depositing $SiO_2$.

7. After a good wafer cleaning silicon dioxide 9 is deposited to a thickness greater than the amorphous silicon thickness, as shown in FIG. 6. Optionally, at this point the wafer can be subjected to a brief high temperature cycle to improve the quality and density of the deposited $SiO_2$.

Figure 7:
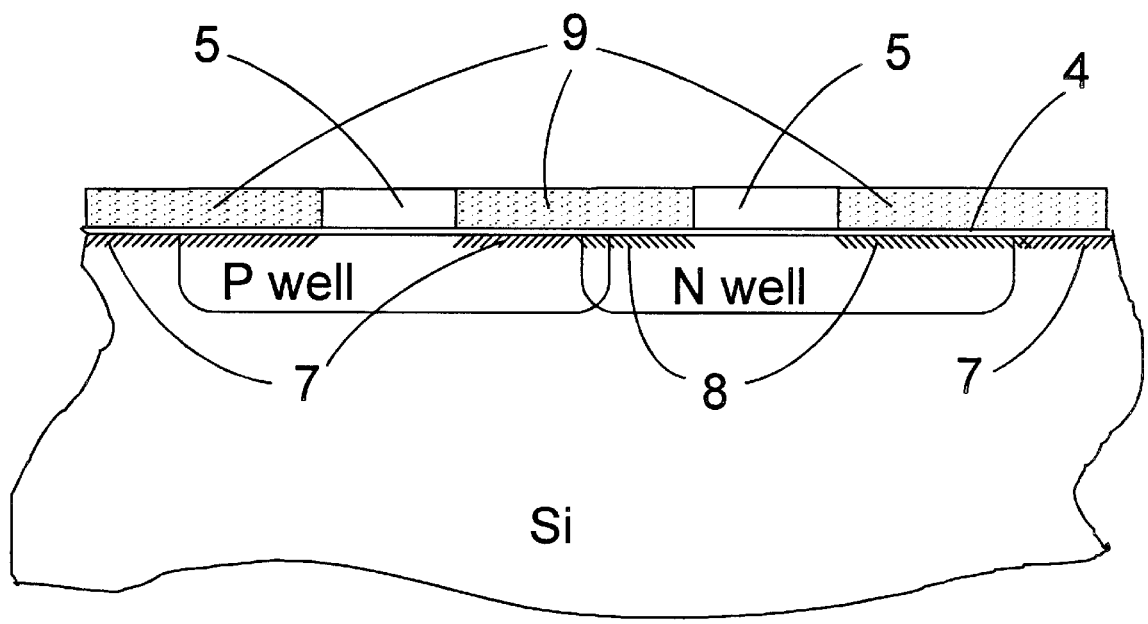
FIG. 7 shows the wafer after chemical mechanical polishing of the deposited $SiO_2$.

8. Next chemical mechanical polishing is performed on the $SiO_2$ using the amorphous Si as an etch stop; FIG. 7 shows the results of this.

Figure 8:
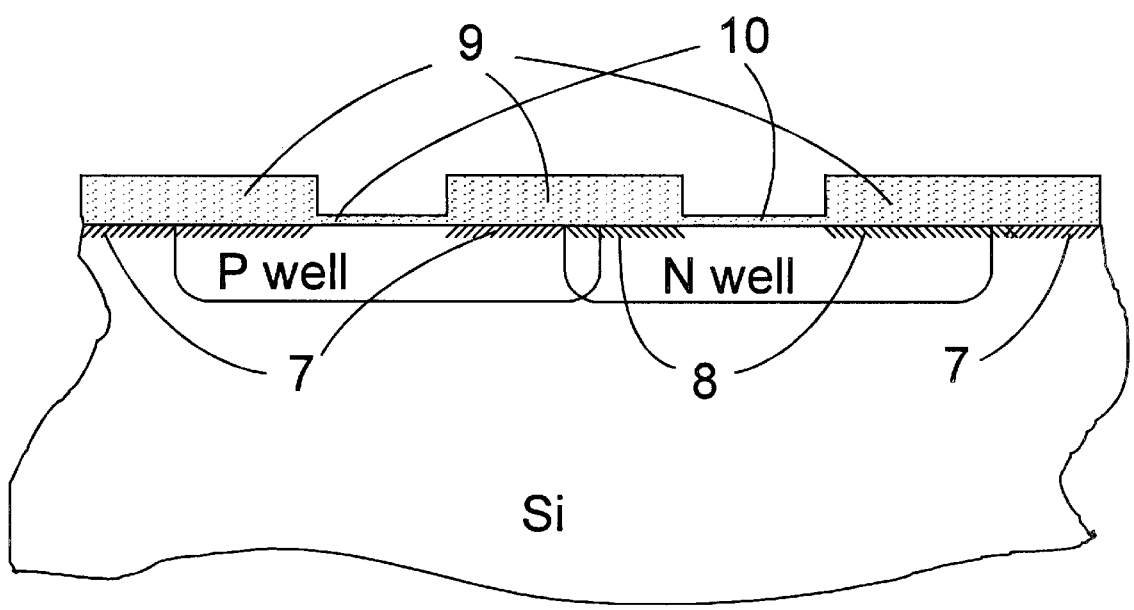
FIG. 8 shows the wafer after removing the amorphous Si.

9. Finally the amorphous Si is removed, the thin underlying oxide is removed and a fresh new gate oxide 10 is grown; FIG. 8 shows this. The temperature required to grow the new gate oxide will anneal the implantations.

Subsequent processing for forming transistors can proceed using well known procedures.

I claim:

1. A CMOS isolation method for a silicon substrate containing N well and P well regions, accomplished by creating a plurality of thick field oxide regions adjacent to thin gate oxide regions, wherein the N well and P well regions have concentrations of N or P type dopant implanted into the silicon substrate only below the thick oxide regions, comprising the steps of:

a) coating over the substrate with a first thin layer of $SiO_2$, with a much thicker layer of amorphous Si over the thin layer of $SiO_2$, and with a first layer of photoresist;

b) patterning the first layer of photoresist over the thicker layer of amorphous Si to cover the N well regions, and to cover portions of the P well regions where NMOS transistors are formed;

c) implanting an acceptor dopant to a depth approximately equal to the amorphous Si thickness, with a concentration significantly greater than the P well concentration at an interface between the silicon substrate and the thin layer of $SiO_2$;

d) etching anisotropically the amorphous Si to the underlying thin layer of $SiO_2$;

e) removing the first photoresist and applying a second photoresist;

f) patterning the second photoresist to cover the P well regions, and to cover the portions of the N well regions where PMOS transistors are formed;

g) implanting a donor dopant to a depth approximately equal to the amorphous Si thickness, with a concentration significantly greater than the N well concentration at an interface between the silicon substrate and the thin layer of $SiO_2$;

h) etching anisotropically the amorphous Si to the underlying thin layer of $SiO_2$;

i) removing the second photoresist;

j) depositing $SiO_2$ to a thickness greater than the amorphous Si thickness;

k) chemical mechanical polishing the $SiO_2$ to a height equal to the amorphous Si thickness;

l) removing the layer of amorphous Si.

2. The method of claim 1, where the amorphous Si is partially anisotropically etched after step (b) and before step (c).

3. The method of claim 1, where the amorphous Si is partially anisotropically etched after step (f) and before step (g).

4. The method of claim 1, where following step (l) the thin layer of $SiO_2$ is removed and a second thin layer of $SiO_2$ is grown.

5. The method of claim 1, where poly Si is used instead of amorphous Si.

6. The method of claim 1, where silicon nitride is used instead of amorphous Si.

7. The method of claim 1, where a material is used instead of amorphous Si, where the material will not deform at the temperature of the $SiO_2$ deposition.

8. The method of claim 1, where the concentration of the dopant atoms implanted into the silicon in steps (c) and (g) is in the range of $5 \times 10^{18}$ to $5 \times 10^{1018}$ atoms per cc.

9. The method of claim 1, where the deposited $SiO_2$ is subjected to a high temperature for densification after step (j) and before step (k).

* * * * *